United States Patent
Deguchi

(10) Patent No.: US 7,429,942 B2
(45) Date of Patent: Sep. 30, 2008

(54) RADIO COMMUNICATION DEVICE

(75) Inventor: Akiteru Deguchi, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/635,008

(22) Filed: Dec. 7, 2006

(65) Prior Publication Data

US 2007/0182613 A1 Aug. 9, 2007

(30) Foreign Application Priority Data

Feb. 9, 2006 (JP) .............................. 2006-032340

(51) Int. Cl.
*H03M 1/12* (2006.01)
*H03M 1/66* (2006.01)

(52) U.S. Cl. ...................................... 341/144; 341/155

(58) Field of Classification Search ................ 341/144, 341/155; 455/558, 101, 899
See application file for complete search history.

(56) References Cited

U.S. PATENT DOCUMENTS 7,024,225 B2 * 4/2006 Ito .............................. 455/558
7,039,370 B2 * 5/2006 Laroia et al. ................ 455/101

FOREIGN PATENT DOCUMENTS

JP 8-204344 8/1996

* cited by examiner

*Primary Examiner*—Peguy JeanPierre
(74) *Attorney, Agent, or Firm*—Nixon & Vanderhye, P.C.

(57) ABSTRACT

A digital signal processor for handling, as a digital signal, data to be transmitted or received and a analog signal processor for handling the data as an analog signal are so arranged as to be spatially separate from each other, and a converter circuit which performs signal format conversion between the digital signal and the analog signal is provided on the analog signal processor side between the digital signal processor and the analog signal processor.

8 Claims, 5 Drawing Sheets

US 7,429,942 B2

RADIO COMMUNICATION DEVICE

This nonprovisional application claims priority under 35 U.S.C. § 119(a) on Patent Application No. 2006-032340 filed in Japan on Feb. 9, 2006, the entire contents of which are hereby incorporated by reference.

BACKGROUND OF THE INVENTION

1. Field of the Invention

The present invention relates to a radio communication device for data transmission and reception, and more specifically, to a technology related to arrangement of circuits composing the radio communication device.

2. Description of Related Art

FIG. 6 is a schematic block diagram of a conventional radio communication device 100. The radio communication device 100 includes: an MAC/BB circuit 101 so configured as to include a data controller (MAC(Media access controller)) which controls a data signal to be transmitted or received and a base band processor (BB) which modulates and demodulates a data signal; an RF circuit (RF converter circuit) 102 that superposes a carrier wave signal of a predetermined frequency band on a modulated signal; and a high frequency circuit 103 that wirelessly transmits and receives a signal via an antenna 105. The MAC/BB circuit 101 performs digital signal processing, while the RF circuit 102 and the high frequency circuit 103 perform analog signal processing.

Normally, in circuits up to the base band processor (BB) which perform digital signal processing, a digital-analog converter circuit 104 is included which converts a digital signal from the base band processor into an analog signal in the RF circuit 102.

Part of the circuits shown in FIG. 6 is formed on one or more integrated circuits, which are mounted on a board. FIG. 7 is a plane view of a component mounting surface of the board on which the radio communication device 100 is mounted. Mounted on this component mounting surface of the board are: an MAC/BB integrated circuit 201 loading the MAC/BB circuit 101 and the digital-analog converter circuit 104 and an RF integrated circuit 202 loading the RF circuit 102; and also the high frequency circuit 103 in such a manner as to surround the RF integrated circuit 202 from all round.

Further, on the component mounting surface of the board, a power supply circuit, and a balun, a filter, and the like in the high frequency circuit 103, all not shown are mounted to thereby form the radio communication device 100.

JP-A-H8-204344 discloses a technology of loading an analog circuit and a digital circuit on the same multilayer wiring board in a mixed manner.

In recent years, more and more radio communication devices have been loaded in compact, portable devices. Thus, there has been demand for a compact radio communication device which is completed with a single module and which can be used without making a designer of the device to consider a high frequency circuit that requires advanced knowledge.

However, to load a radio communication device in a smaller device, when the conventional radio communication device as shown in FIGS. 6 and 7 is mounted on a smaller board, in particular, a high frequency analog circuit part, such as the high frequency circuit 103, and a digital signal processor, such as the MAC/BB circuit 101 are located close to each other. Thus, noise from the digital signal processor is superposed on a weak signal in the high frequency analog circuit part, thus resulting in a problem that a required SIN ratio cannot be ensured especially upon reception of the weak signal.

BRIEF SUMMARY

A radio communication device according to on example embodiment comprises: a digital signal processor; an analog signal processor; and, a converter circuit. The digital signal processor is configured to handle, as a digital signal, data to be transmitted or received. The analog signal processor is configured to handle the data as an analog signal, The digital signal processor and the analog signal processor are so arranged as to be spatially separate from each other. The converter circuit is provided on the analog signal processor side between the digital signal processor and the analog signal processor and performs signal format conversion between the digital signal and the analog signal.

Arranging the digital signal processor and the analog signal processor in such a manner as to spatially separate them from each other reduces noise from the digital signal processor which is superposed on the analog signal, thus allowing for an improvement in the S/N ratio. Moreover, although the separation described above results in relatively long routing of wires between the digital signal processor and the analog signal processor, by providing the converter circuit on the analog signal processor side, a transmission signal of the wire routed serves as a digital signal, and thus is less susceptible to disturbance such as noise or the like than an analog signal to be routed.

For example, the radio communication device includes a board for mounting the digital signal processor, the analog signal processor, and the converter circuit thereon.

More specifically, for example, the analog signal processor and the converter circuit are arranged on a first surface side of the board, and the digital signal processor is arranged on a second surface side of the board which is different from the first surface side.

For example, the board is multilayer wiring board having a plurality of wiring layers. A digital ground part is provided in a wiring layer inside the board, and an analog ground part is provided in a wiring layer on the first surface side of the digital ground part, and a wiring layer on the first surface side of the analog ground part is assigned as an analog wiring layer.

Consequently, the wiring region where a digital signal is propagated and the wiring region where an analog signal is propagated can be discriminated, thus allowing for an improvement in the S/N ratio.

For example, digital signal transfer is performed between a conductor on the first surface and a conductor on a wiring layer on the second surface side of the digital ground part via a through-hole which links the conductors together and which is provided in the board.

Consequently, a problem such that the digital signal is unnecessarily propagated in the analog wiring layer can be reduced.

For example, the analog signal processor includes a high frequency circuit for transmitting or receiving an analog signal of a high frequency which permits radio transmission. Part or all of the high frequency circuit is arranged near a first side of the board, and the converter circuit is arranged near a second side located opposite to the first side.

As described above, the arrangement of the converter circuit, which inputs or outputs a digital signal, relatively far away from the high frequency circuit allows for an improvement in the S/N ratio.

Further, for example, the high frequency circuit includes a receiving circuit for wirelessly receiving a signal and a transmitting circuit for wirelessly transmitting a signal. The receiving circuit is arranged near the first side, and the transmitting circuit is arranged near a third side located between the first and second sides.

The arrangement of the transmitting circuit handling a signal having a relatively strong intensity away from the receiving circuit handling a weak signal in particular allows for an improvement in the S/N ratio upon reception.

A radio communication device according to a second example embodiment comprises: a digital signal processor for handling, as a digital signal, data to be transmitted or received; an analog signal processor for handling the data as an analog signal; a converter circuit which is provided between the digital signal processor and the analog signal processor and which performs signal format conversion between the digital signal and the analog signal; and a board for mounting the digital signal processor, the analog signal processor, and the converter circuit thereon. The analog signal processor comprises a high frequency circuit for transmitting or receiving an analog signal of a high frequency which permits radio transmission, and an RF circuit (for performing frequency conversion of an analog signal) interposed between the high frequency circuit and the converter circuit. Part or all of the high frequency circuit is arranged in a first region near a first side of the board. The digital signal processor and the converter circuit are arranged in a second region near a second side located opposite to the first side. The RF circuit is arranged in a region between the first and second regions.

Consequently, the digital signal processor and the high frequency circuit are spatially separated from each other. Thus, noise from the digital signal processor which is superposed on the analog signal handled in the high frequency circuit is reduced, thus allowing for an improvement in the S/N ratio.

In the radio communication device according to the second aspect, for example, the high frequency circuit includes a receiving circuit for wirelessly receiving a signal and a transmitting circuit for wirelessly transmitting a signal. The receiving circuit is arranged near the first side and the transmitting circuit is arranged near a third side located between the first and second sides.

A radio communication device according to a third example embodiment comprises: a digital signal processor for handling, as digital signal, data to be transmitted or received; an analog signal processor for handling the data as an analog signal; a converter circuit which is provided between the digital signal processor and the analog signal processor and which performs signal format conversion between the digital signal and the analog signal; and a board for mounting the digital signal processor, the analog signal processor, and the converter circuit thereon. The analog signal processor is arranged on a first surface side of the board, the digital signal processor and the converter circuit are arranged on a second surface side of the board which is different from the first surface side. The board is a multilayer wiring board comprises a plurality of wiring layers. A digital ground part is provided in a wiring layer inside the board, an analog ground part is provided in a wiring layer on the first surface side of the digital ground part, and a wiring layer on the first surface side of the analog ground part is assigned as an analog wiring layer.

Even with such configuration, noise from the digital signal processor which is superposed on the analog signal handled in the high frequency circuit is reduced, thus allowing for an improvement in the S/N ratio.

According to the radio communication device of the example embodiments, the S/N ratio can be improved.

DETAILED DESCRIPTION OF PREFERRED EMBODIMENTS

First Embodiment

Figure 1:
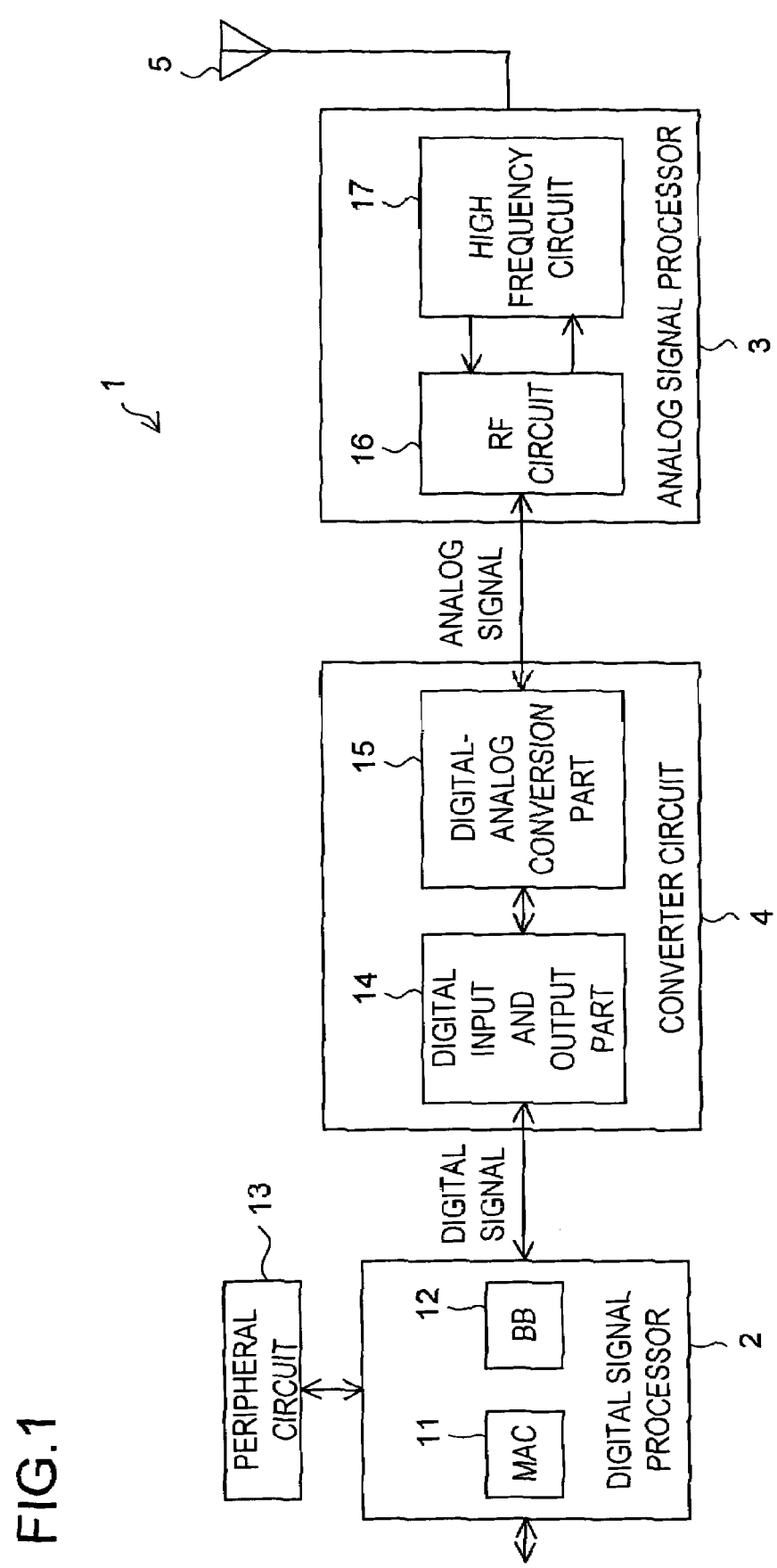
FIG. 1 is schematic block diagram of a radio communication device according to an example embodiment.

Hereinafter, example embodiments will be described in detail, with reference to the accompanying drawings. FIG. 1 is a schematic block diagram of a radio communication device 1 according to a first example embodiment. The radio communication device 1 wirelessly transmits and receives various data to and from a different radio communication device.

The radio communication device 1 comprises: a digital signal processor 2 which inputs and outputs a digital signal; an analog signal processor 3 which inputs and outputs an analog signal; a converter circuit 4 which is provided between the digital signal processor 2 and the analog signal processor 3 and which performs signal format conversion between a digital signal and an analog signal; an antenna 5; and a peripheral circuit 13. The digital signal processor 2 is formed of digital circuits which handle digital signals, and the analog signal processor 3 is formed of analog circuits which handle analog signals.

The digital signal processor 2 comprises: a data controller (can also be referred to as MAC (Media access controller), and thus hereinafter is referred to as MAC) 11 which controls a data signal to be transmitted and received, and a base band processor 12 (hereinafter, referred to as BB 12) which modulates and demodulates a data signal.

To the MAC 11 and the BB 12, the peripheral circuit 13 is connected. The peripheral circuit 13 is provided at the periphery of the MAC 11 and the BB 12 so that the MAC 11 and the BB 12 can execute required processing. The peripheral circuit 13 is, for example, a PLL (Phase locked loop) loop filter or the like used for supplying a clock signal to the MAC 11 or the BB 12.

The analog signal processor 3 comprises: an RF circuit (RF converter circuit) 16 which superposes a carrier wave signal of a predetermined frequency band on a provided analog signal; and a high frequency circuit 17 which wirelessly transmits and receives a signal via the antenna 5.

Figure 2:
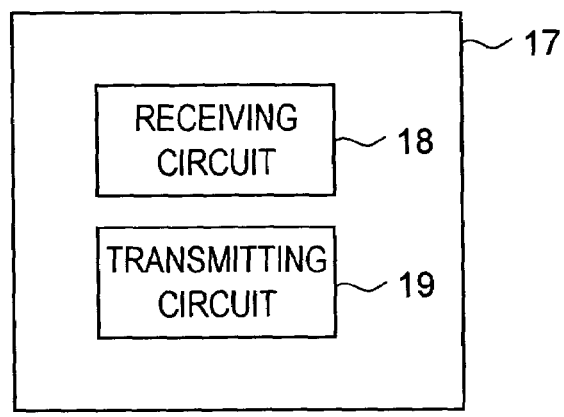
FIG. 2 is an internal block diagram of a high frequency circuit of FIG. 1.

The high frequency circuit 17, as shown in FIG. 2, is so configured as to comprise a receiving circuit 18 and a transmitting circuit 19. Part of circuits comprising the receiving circuit 18 and part of circuits comprising the transmitting circuit 19 may be shared.

The receiving circuit 18 is so configured as to include a receiving amplifier for amplifying a received signal, a receiving filter which limits the frequency band of a signal received via the antenna 5, and the like (all not shown). The transmitting circuit 19 is so configured as to include a transmitting amplifier (power amplifier)for amplifying a signal to be transmitted, a transmitting filter which limits the frequency band of a signal transmitted via the antenna 5, and the like (all not shown).

Moreover, the high frequency circuit 17 includes: a balun which performs impedance conversion (performs impedance matching) between a balancing circuit (for example, the antenna 5) and a non-balancing circuit (for example, a coaxial cable connected to the antenna 5), and the like.

The converter circuit 4 comprises: a digital input and output part 14 connected to the digital signal processor 2; and a digital-analog conversion part 15 connected to the RF circuit 16. The digital input and output part 14, while performing required conversion processing, performs transfer of a digital signal between the digital signal processor 2 and the digital-analog conversion part 15. The digital input and output part 14 performs, for example, signal format conversion between a serial signal and a parallel signal (serial-parallel conversion).

The digital-analog conversion part 15 converts a digital signal from the digital input and output part 14 into an analog signal and outputs it to the RF circuit 16, and, on the other hand, converts an analog signal from the RF circuit 16 into a digital signal and outputs it to the digital input and output part 14. In this manner, the converter circuit 4 functions as an A/D converter circuit which converts an analog signal into a digital signal as well as a D/A converter circuit which converts a digital signal into an analog signal.

Hereinafter, operation performed upon data transmission from the radio communication device 1 will be described. First, a data signal to be transmitted is supplied as a digital signal from a signal source, not shown, to the digital signal processor 2. The BB 12, while using the peripheral circuit 13, subjects the supplied data signal to predetermined modulation, and outputs the modulated digital signal to the digital input and output part 14. Meanwhile, the MAC 11, while using the peripheral circuit 13, adequately controls the flow of the data signal transmitted from the signal source described above to the BB 12.

The digital input and output part 14 subjects the modulated received digital signal to predetermined conversion processing, and outputs it to the digital-analog conversion part 15. The digital-analog conversion part 15 converts the digital signal supplied from the digital input and output part 14 into an analog signal, and outputs it to the RF circuit 16.

The RF circuit 16 superposes the carrier wave signal described above on the analog signal from the digital-analog conversion part 15 to thereby perform frequency conversion on this analog signal. Through this frequency conversion, the analog signal from the digital-analog conversion part 15 (analog signal of an intermediate frequency) is converted into an analog signal of a high frequency that can be propagated in the space (can be transferred wirelessly).

The analog signal of a high frequency obtained through the frequency conversion by the RF circuit 16 is transmitted to the high frequency circuit 17. The high frequency circuit 17 supplies this analog signal of a high frequency to the antenna 5 via the transmitting amplifier, the transmission filter, and the like of the transmitting circuit 19 to thereby perform wireless transmission from the antenna 5 (it is radiated as a radio wave into the space).

Next, operation performed upon data reception by the radio communication device 1 will be described. A radio wave indicating data to be received by the radio communication device 1 and radiated from an antenna of a different radio communication device is received by the receiving circuit 18 of the high frequency circuit 17 via the antenna 5. The received analog signal of a high frequency is transmitted to the RF circuit 16 via the receiving amplifier, the receiving filter, and the like in the receiving circuit 18.

The RF circuit 16 superposes the carrier wave signal described above on the analog signal of a high frequency transmitted from the receiving circuit 18 of the high frequency circuit 17 to thereby perform frequency conversion on this analog signal of a high frequency. Through this frequency conversion, the analog signal of a high frequency from the receiving circuit 18 of the high frequency circuit 17 is converted into an analog signal of a relatively low frequency (analog signal of an intermediate frequency). The RF circuit 16 outputs the obtained analog signal of a relatively low frequency to the digital-analog conversion part 15.

The digital-analog conversion part 15 converts the analog signal from the RF circuit 16 into a digital signal, and outputs this digital signal to the digital input and output part 14. The digital input and output part 14 subjects the digital signal received from the digital-analog conversion part 15 to predetermined conversion processing, and then outputs it to the digital signal processor 2.

The BB 12 of the digital signal processor 2, while using the peripheral circuit 13, demodulates the digital signal transmitted from the digital input and output part 14. The digital signal obtained by this demodulation is a data signal indicating data to be received by the radio communication device 1, and this digital data signal is transmitted from the digital signal processor 2 to a data signal usage part (not shown) which uses a data signal. Meanwhile, the MAC 11, while using the peripheral circuit 13, adequately controls the flow of the data signal transmitted from the BB 12 described above to the data signal usage part. For example, the data signal usage part described above is a display device or an audio output device, which performs video or audio reproduction or the like based on the received data signal.

Figure 3:
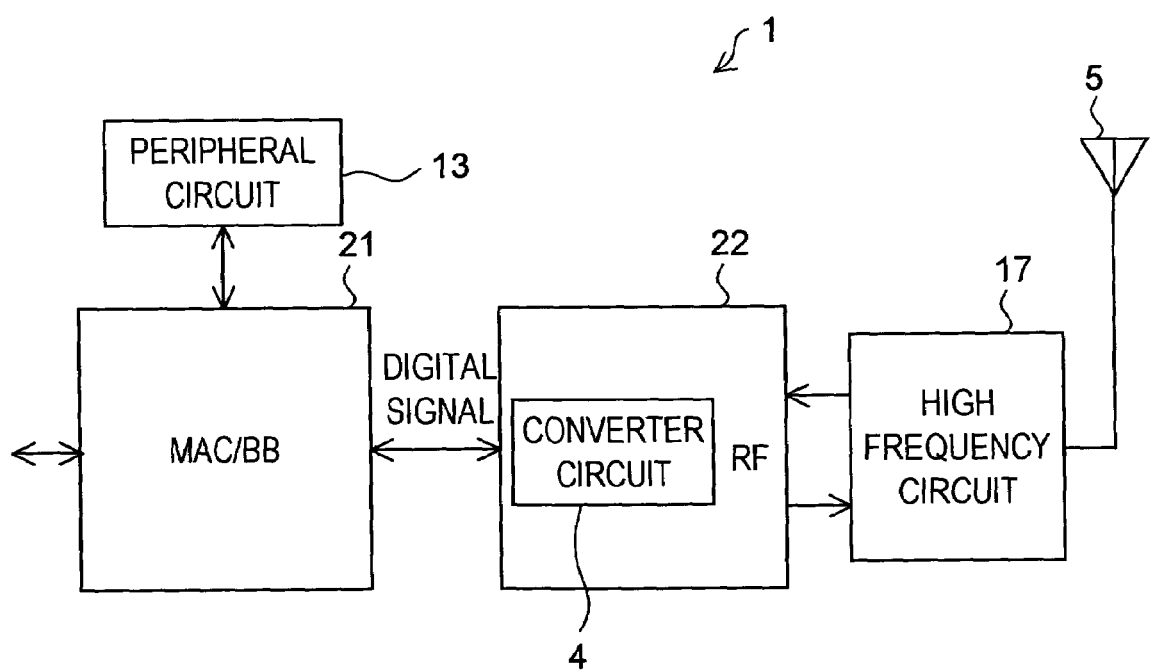
FIG. 3 shows configuration of the radio communication device of FIG. 1.

The radio communication device 1 is constructed with an integrated circuit. More specifically, as shown in FIG. 3, the radio communication device 1 is so constructed as to include an MAC/BB integrated circuit 21 and an RF integrated circuit 22. On the MAC/BB integrated circuit 21, the MAC 11 and the BB 12 are loaded. On the RF integrated circuit 22, not only the RF circuit 16 but also the converter circuit 4 is loaded. Note that, in FIG. 3, portions equivalent to those in FIG. 1 are provided with the same numerals.

Figure 4:
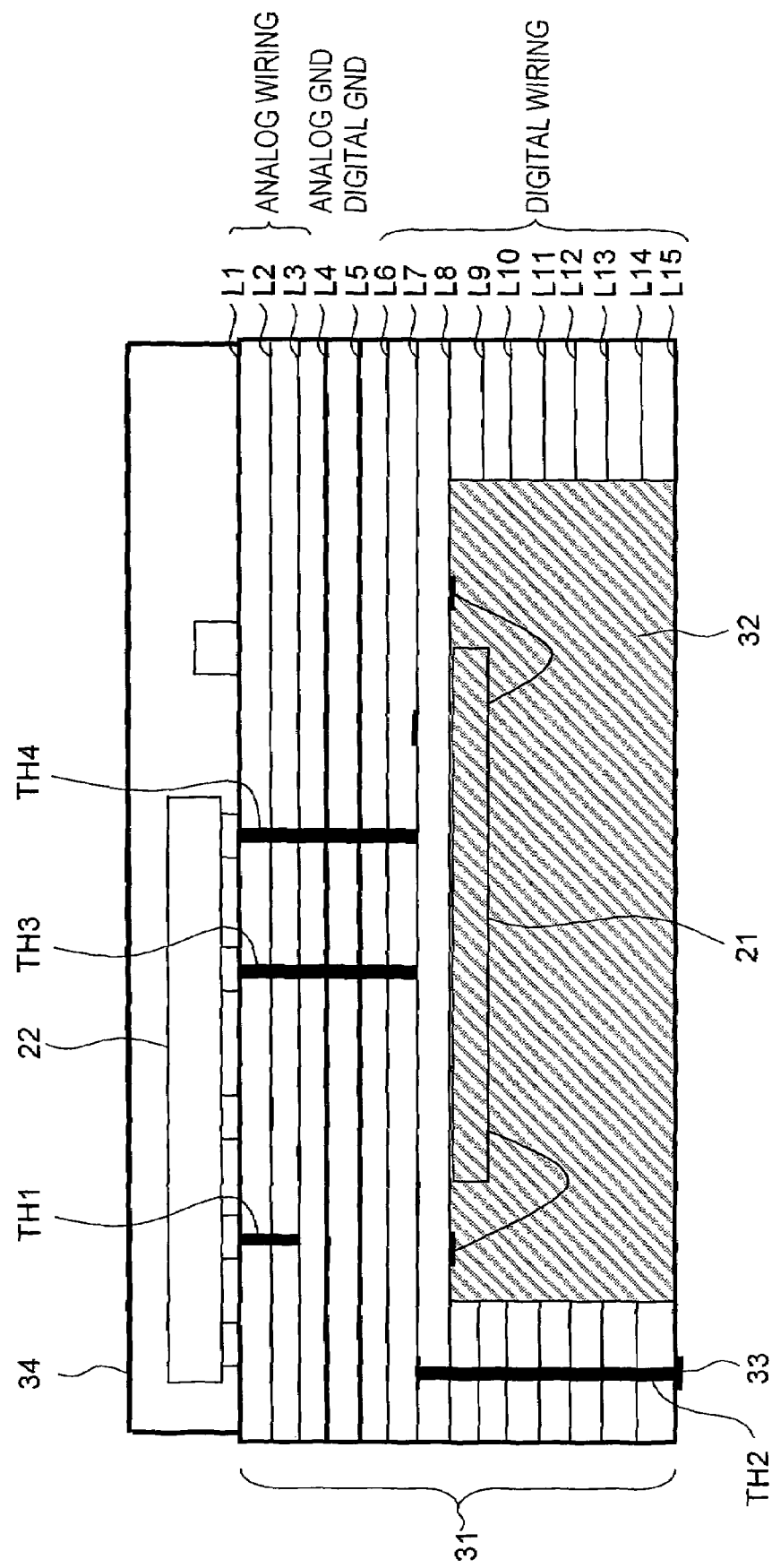
FIG. 4 is a schematic sectional diagram of a board on which circuits forming the radio communication device of FIG. 1 are mounted.

FIG. 4 is a schematic sectional view of a board (printed board) 31 on which the circuits forming the radio communication device 1 are mounted. In FIG. 4, portions equivalent to those in the other figures are provided with the same numerals. The radio communication device 1 is constructed by mounting on the board 31 the digital signal processor 2, the analog signal processor 3, the converter circuit 4, the peripheral circuit 13, and the like. The board 31 can be considered as a component of the radio communication device 1.

The board 31 is a multilayer wiring board formed of a plurality of wiring layers superposed one on another. For example, the board 31 is formed with an LTCC (Low Temperature Co-fired Ceramics).

The board 31 of FIG. 4 has 15 wiring layers including the wiring layer L1 exposed to the component mounting surface of the board 31 and the wiring layer L15 exposed to the surface opposite to the component mounting surface. The surface opposite to the component mounting surface functions as a wire bonding surface or a terminal surface. It is of course permitted to adopt a multilayer wiring board whose number of wiring layers is other than 15.

The board 31 has the wiring layers L1, L2, L3, L4, L5, L6, L7, L8, L9, L10, L11, L12, L13, L14 and L15 arranged in this order from the wiring layer L1 toward the wiring layer L15. In the wiring layers L1 to L15, conductors of an arbitrary shape can be arranged, each of which functions as a wire for propagating various signals. The wiring layers L1 to L15 are, in principle, electrically insulated from one another.

Hereinafter, procedures of mounting the radio communication device 1 on the board 31 will be described. First, to construct the radio communication device 1, on the substantially center of the surface opposite to the component mounting surface of the board 31, a cavity 32 is formed as a depression. The cavity 32 forms a space of a substantially rectangular parallelepiped shape. The formation of the cavity 32 removes part of each of the wiring layers L9 to L15 from the board 31. As a result, the number of wiring layers at the outer periphery of the board 31 remains 15, while the number of wiring layers at the center of the board 31 decreases to 8.

At the outer periphery of the board 31, one or more terminals 33 (only one terminal is shown in FIG. 4) are provided. This terminal 33 is provided on the wiring layer L15.

On the wiring layer L8 which is exposed as a result of forming the cavity 32, a wafer chip of the MAC/BB integrated circuit 21 is directly mounted so as to be housed in the cavity 32. The wafer chip of the MAC/BB integrated circuit 21 is electrically connected to a terminal provided on the wiring layer L8 through wire bonding. Then, the cavity 32 is filled with and then sealed with an insulator of resin or the like.

On the other hand, on the component mounting surface of the board 31 (that is, on the wiring layer L1), the circuits, other than the MAC/BB integrated circuit 21, forming the radio communication device 1 (the RF integrated circuit 22 and the like) are mounted. Further, a shield case 34 formed of a conductor is fixed to the board 31 in such a manner as to cover the entire components on the component mounting surface.

Accordingly, the height of the board 31 (thickness) including the cavity 32 can be controlled at approximately 0.8 mm (in millimeters). In addition, the sum of the height of the board 31 alone and the height of the components on the component mounting surface can be controlled at approximately 1.5 to 2 mm. Thus, the board 31 realizing the radio communication device 1 can be treated as if it were a single LSI (Large Scale Integration).

For example, it is possible that the board 31 realizing the radio communication device 1 is treated as a component for single communication and is mounted on a board of a portable terminal, such as a cellular phone (not shown) or the like.

Next, each wiring layer of the board 31 will be described. In this embodiment, at the center in the thickness direction of the board 31, a digital ground layer and an analog ground layer are provided.

More specifically, as shown in FIG. 4, a plate-like conductor layer which functions as the digital ground layer (digital ground part) (hereinafter, referred to as digital GND) is provided in the wiring layer L5, and a plate-like conductor layer which functions as the analog ground layer (analog ground part) (hereinafter, referred to as analog GND) is provided in the wiring layer L4.

The digital GND is provided in the wiring layer L5 so that the conductor area, excluding a portion where a through-hole or the like is formed, is formed as widely as possible. The analog GND is formed in the wiring layer L4 so that the conductor area, excluding a portion where a through-hole or the like is formed, is formed as widely as possible. The aforementioned digital signal, which is treated in the radio communication device 1, refers to the potential of the digital GND, while the aforementioned analog signal which is treated in the radio communication device 1, refers to the potential of the analog GND.

Then, the wiring layers located closer to the component mounting surface than the analog GND are assigned as the analog wiring layers (analog wiring region). That is, the wiring layers L1 to L3 are assigned as the analog wiring layers. The analog wiring layers are used for propagating, inside the board 31, an analog signal treated in the circuits between the digital-analog conversion part 15 and the antenna 5.

On the other hand, the wiring layers located closer to the wire bonding surface (or the terminal surface) than the digital GND are assigned as the digital wiring layers (digital wiring regions). That is, the wiring layers L6 to L15 are assigned as the digital wiring layers. The digital wiring layers are used for propagating, inside the board 31, a digital signal treated in the circuits between the digital-analog conversion part 15 and the digital signal processor 2 (and the peripheral circuit 13).

In the board 31, a large number of through-holes are provided for permitting conduction between the wires provided in the wiring layers. FIG. 4 shows, as an example, through-holes TH1, TH2, TH3, and TH4.

The through-hole TH1 electrically connects together the wire provided in the wiring layer L3 and the wire provided in the wiring layer L1. The through-hole TH2 electrically connects together a terminal 31 provided in the wiring layer L15 and the wire provided in the wiring layer L7. The wire provided in the wiring layer L7 is electrically connected to the MAC/BB integrated circuit 21 via a different through-hole or the like. That is, the terminal 33 and the MAC/BB integrated circuit 21 are electrically connected together, and the digital signal processor 2, for example, inputs and outputs the data signal described above via the terminal 33. The through-holes TH3 and TH4 will be described later.

When the radio communication device 1 is formed by using the board 31 as shown in FIG. 4, all the components, other than the MAC/BB integrated circuit 21 to be mounted in the cavity 32, need to be arranged on the component mounting surface (that is, on the wiring layer L1). Thus, even when the digital wiring layers and the analog wiring layers are separately assigned, on part of the component mounting surface, the portion involved in handling a digital signal and a portion involved in handling an analog signal are mixed together. Even in such a case, arrangement of components on the component mounting surface is designed so that adverse effect of a digital signal on the high frequency circuit 17 can be reduced to a minimum possible degree.

Figure 5:
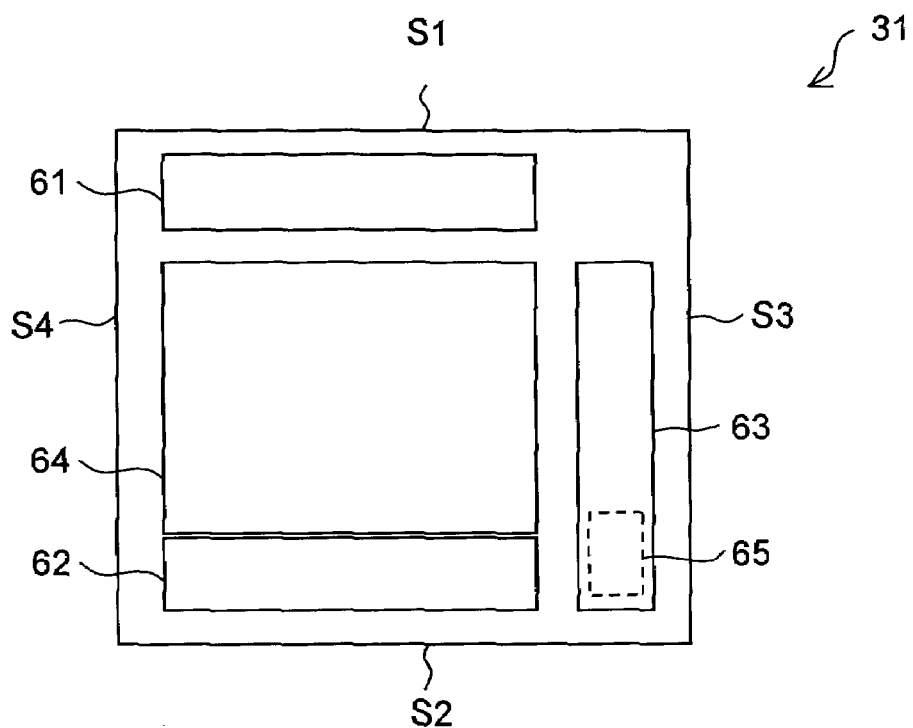
FIG. 5 is a diagram for explaining the circuit arrangement on the component mounting surface of the board of FIG. 4.
Figure 6:
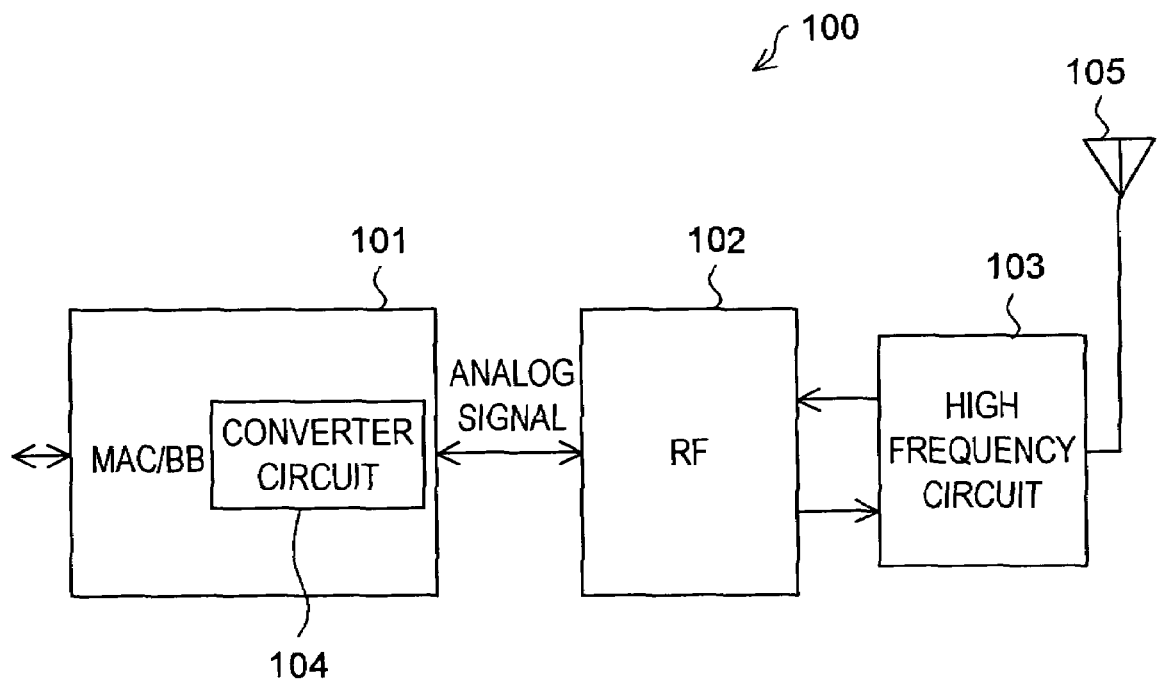
FIG. 6 is a schematic block diagram of a conventional radio communication device.
Figure 7:
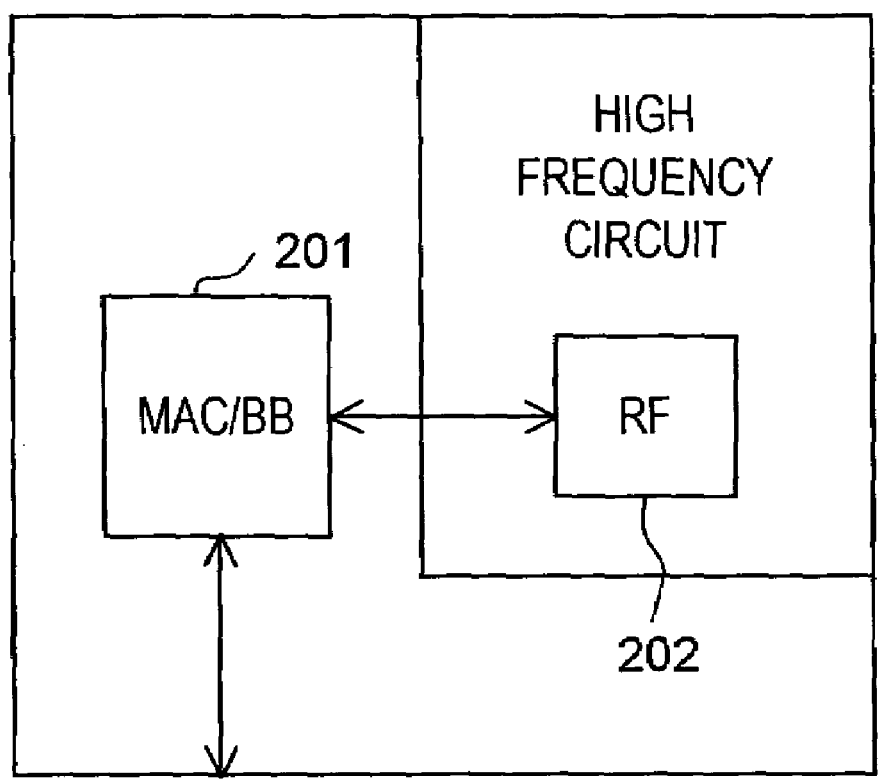
FIG. 7 is a plane view of a board on which the radio communication device of FIG. 6 is mounted.

FIG. 5 is a plane view of the board 31 as viewed from the component mounting surface side. The component mounting surface of the board 31 has a substantially square shape with four sides thereof referred to as sides S1, S2, S3, and S4 as shown in FIG. 5. The side S1 opposes the side S2, and the side S1 and the side S2 are parallel to each other. The side S3 opposes the side S4, and the side S3 and the side S4 are parallel to each other.

On the component mounting surface of the board 31, numeral 61 denotes a region near the side S1, and numeral 62 denotes a region near the side S2. Numeral 64 is a region located between the region 61 and the region 62. Numeral 63 is a region near the side S3. The region 63 is located on the side S3 side of the regions 61, 62, and 64. For example, as shown in FIG. 5, the regions 61 to 64 are not superposed on one another at any portion thereof. Numeral 65 is a region located in the region 63 on the side S2 side thereof. Note that, as shown in FIG. 5, the regions 61 to 65 are square-shaped for convenience, but the shapes of the regions 61 to 65 do not have to be a square.

On the component mounting surface of the board 31, of the high frequency circuit 17, the receiving circuit 18 involved in handling a weak high frequency analog signal in particular is arranged in the region 61, while the peripheral circuit 13 (component forming the peripheral circuit 13), the digital input and output part 14, and the digital-analog conversion part 15 involved in handling a digital signal are arranged in the region 62. The RF circuit 16 is arranged in the region 64. Since the digital input and output part 14, the digital-analog conversion part 15, and the RF circuit 16 are loaded on the RF integrated circuit 22 (see FIG. 3), the RF integrated circuit 22 is so arranged as to extend across part of the region 62 and the region 64.

As described above, the receiving circuit 18 of the high frequency circuit 17 is so arranged as to be spatially separated from the region 62 where a digital signal is propagated, thereby permitting effect of noise exerted on the receiving circuit 18 to be controlled at a minimum.

Of the high frequency circuit 17, the transmitting circuit 19 involved in handling a high frequency analog signal of a relatively strong signal intensity is arranged in the region 63. In the region 65, the transmitting amplifier of the transmitting circuit 19 described above (power amplifier) is arranged.

Arranging the transmitting circuit 19 so as to be spatially separated from the region 61 where the receiving circuit 18 is arranged makes it difficult for noise from the transmitting circuit 19 to adversely affect the receiving circuit 18. Since the transmitting circuit 19 handles a high frequency analog signal of a relatively strong signal intensity, even arrangement of the transmitting circuit 19 in the region 63 located closer to the region 62 than the region 61 hardly results in harmful effect caused by noise or the like.

It is also possible that, in accordance with the shape of the board 31 or the like, the entire high frequency circuit 17 including the receiving circuit 18 and the transmitting circuit 19 is arranged in the region 61.

When a digital signal is transmitted from the wires in the wiring layers L6 to L15 (digital wiring layers) to the component mounting surface (the wiring layer L1), this is achieved directly via the through-holes. As an example of such through-holes, FIG. 4 shows the through-holes TH3 and TH4.

The through-hole TH3 electrically connects together the wire provided in the wiring layer L7 and the wire (or terminal) provided in the wiring layer L1. For example, the aforementioned wire provided in the wiring layer L7 is connected to the digital signal processor 2 (the MAC/BB integrated circuit 21) via a different through-hole, and the aforementioned wire (or terminal) provided in the wiring layer L1 is connected to the digital input and output part 14 of the RF integrated circuit 22. That is, for example, digital signal transfer is performed via the through-hole TH3 between the digital signal processor 2 (the MAC/BB integrated circuit 21) on the wire bonding surface side and the digital input and output part 14 on the component mounting surface side. The through-hole TH4 has the same function as that of the through-hole TH3.

For example, via the through-hole TH3 or TH4, signal transfer may be performed between the digital signal processor 2 (the MAC/BB integrated circuit 21) on the wire bonding surface side and the peripheral circuit 13 on the component mounting surface side.

A signal propagated by the wire in the wiring layer L7 connected to the through-holes TH3 and TH4 is directly transmitted to the wire (or terminal) in the wiring layer L1 as the component mounting surface without being routed in the wiring layers L2 and L3. That is, the through-holes TH3 and TH4 are connected not to the wires in the wiring layers L2 and L3 (and the wiring layer L4) but directly to the wire (or terminal) in the wiring layer L1 as the component mounting surface.

Moreover, in view of mutual effect among the circuits, the analog wiring layers may be used separately. For example, the wiring layer with wires forming the high frequency circuit 17, the wiring layer with wires forming an analog power supply circuit (not shown) for supplying power to the analog signal processor 3, and the wiring layer with wires forming a VCO (Voltage Controlled Oscillator; not shown) used for obtaining the carrier wave signal described above or the like may be configured to be different from one another. To wire them in the same wiring layer, their wires may be spatially separated from one another inside the layer.

If possible, the peripheral circuit 13 may also be arranged on the wire bonding surface side. That is, components of the peripheral circuit 13 may be arranged on the wiring layer L8 or L15.

This embodiment is based on the assumption that the shape of the component mounting surface of the board 31 is substantially square, but the shape of the board where the radio communication device 1 is mounted is not limited to the square. In short, on the component mounting surface of the board where the radio communication device 1 is mounted, when the receiving circuit 18 (or both the receiving circuit 18 and the transmitting circuit 19) is arranged in the first region located near the first side, the converter circuit 4 (or the converter circuit 4 and the peripheral circuit 13) may be arranged in the second region located near the second side furthest from the first side. Then, other circuits forming the radio communication device 1 (the RF circuit 16 and the like) may be arranged in the region between the first region and the second region described above.

As described above, by arranging the digital signal processor 2 on the wire bonding surface of the board 31 while arranging the analog signal processor 3 on the component mounting surface, the digital signal processor 2 and the analog signal processor 3 are spatially separated from each other. This reduces noise generated from the digital signal processor 2 which is superposed on an analog signal handled in the high frequency circuit 17.

The separation described above results in relatively long routing of the wires between the digital signal processor 2 and the analog signal processor 3. However, if the converter circuit 4 is provided on the component mounting surface on the analog signal processor 3 side, a transmission signal transmitted through the wire routed serves as a digital signal, and thus is less susceptible to disturbance such as noise or the like than an analog signal to be routed.

Providing the antenna 5 and a host controller for data communication (not shown) outside of the board 31 permits radio communication of arbitrary data. Then, as described above, it is possible to handle the board 31 implementing the radio communication device 1 as if it were a single LSI (Large Scale Integration). Therefore, a designer of a device including the radio communication device 1 can handle the radio communication device 1 as a compact communication module and easily assembles it into the device without considering the presence of a high frequency circuit that requires advanced knowledge for its design.

Second Embodiment

Moreover, although this is inconsistent with the description above, not only the converter circuit 4 and the peripheral circuit 13 but also the digital signal processor 2 may be arranged in the region 62 on the component mounting surface of the board 31. An embodiment achieved by making such modification to the first embodiment is provided as a second embodiment. In the second embodiment, portions not specifically described are equivalent to those in the first embodiment.

As is the case with the first embodiment, also in the second embodiment, the receiving circuit 18 is arranged in the region 61 and the transmitting circuit 19 is arranged in the region 63, or the entire high frequency circuit 17 including both the receiving circuit 18 and the transmitting circuit 19 is arranged in the region 61.

Thus, the digital signal processor 2 and the high frequency circuit 17 are so arranged as to be spatially separated from each other, thus reducing the noise from the digital signal processor 2 which is superposed on an analog signal handled in the high frequency circuit 17.

Third Embodiment

Moreover, although this is inconsistent with the description above, not only the MAC/BB integrated circuit 22 forming the digital signal processor 2 but also the converter circuit 4 and the peripheral circuit 13 may be arranged on the wire bonding surface side of the board 31 (that is, they may be arranged on the wiring layer L8 or L15). An embodiment achieved by making such modification to the first embodiment is provided as a third embodiment. In third embodiment, portions not specifically described are equivalent to those in the first embodiment. To achieve such modification, the converter circuit 4 is removed from the RF integrated circuit 22 of FIG. 3.

In the third embodiment, only the analog signal processor 3 is arranged on the component mounting surface, and the analog wiring layers and the digital wiring layers are clearly separated from each other. Thus, also in the third embodiment, the noise from the digital signal processor 2 which is superposed on a weak signal handled in the high frequency circuit 17 is reduced.

What is claimed is:

1. A radio communication device comprising:
    a digital signal processor configured to handle, as a digital signal, data to be transmitted or received;
    an analog signal processor configured to handle the data as an analog signal;
    a converter circuit provided between the digital signal processor and the analog signal processor and configured to perform signal format conversion between the digital signal and the analog signal;
    a board on which the digital signal processor, the analog signal processor, and the converter circuit are mounted;
    the digital signal processor and the analog signal processor being arranged on the board so as to be spatially separate from each other;
    wherein the analog signal processor and the converter circuit are arranged on a first surface of the board, and the digital signal processor is arranged on a second surface of the board which is different from the first surface.

2. The radio communication device according to claim 1, wherein the board is multilayer wiring board having a plurality of wiring layers,
    wherein a digital ground part is provided in a wiring layer inside the board, and an analog ground part is provided in a wiring layer on the first surface of the digital ground part, and a wiring layer on the first surface of the analog ground part is assigned as an analog wiring layer.

3. The radio communication device according to claim 2, wherein digital signal transfer is performed between a conductor on the first surface and a conductor on a wiring layer on the second surface of the digital ground part via a through-hole which links the conductors together and which is provided in the board.

4. A radio communication device comprising:
    a digital signal processor configured to handle, as a digital signal, data to be transmitted or received;
    an analog signal processor configured to handle the data as an analog signal;
    a converter circuit provided between the digital signal processor and the analog signal processor and configured to perform signal format conversion between the digital signal and the analog signal;
    a board on which the digital signal processor, the analog signal processor, and the converter circuit are mounted;
    the digital signal processor and the analog signal processor being arranged on the board so as to be spatially separate from each other;
    wherein the analog signal processor comprises a high frequency circuit for transmitting or receiving an analog signal of a high frequency which permits radio transmission, and
    wherein part or all of the high frequency circuit is arranged near a first side of the board, and the converter circuit is arranged near a second side located opposite to the first side.

5. The radio communication device according to claim 4, wherein the high frequency circuit comprises a receiving circuit for wirelessly receiving a signal and a transmitting circuit for wirelessly transmitting a signal, and
    wherein the receiving circuit is arranged near the first side, and the transmitting circuit is arranged near a third side located between the first and second sides.

6. A radio communication device comprising:
    a digital signal processor configured to handle, as a digital signal, data to be transmitted or received;
    an analog signal processor configured to handle the data as an analog signal;
    a converter circuit which is provided between the digital signal processor and the analog signal processor and which is configured to perform signal format conversion between the digital signal and the analog signal; and
    a board for mounting the digital signal processor, the analog signal processor, and the converter circuit thereon,
    wherein the analog signal processor comprises a high frequency circuit configured to transmit or receive an analog signal of a high frequency which permits radio transmission, and an RF circuit configured to perform frequency conversion of an analog signal, interposed between the high frequency circuit and the converter circuit, and
    wherein part or all of the high frequency circuit is arranged in a first region near a first side of the board, the digital signal processor and the converter circuit are arranged in a second region near a second side located opposite to the first side, and the RF circuit is arranged in a region between the first and second regions.

7. The radio communication device according to claim 6,
wherein the high frequency circuit comprises a receiving circuit configured to wirelessly receive a signal and a transmitting circuit configured to wirelessly transmit a signal, and wherein the receiving circuit is arranged near the first side and the transmitting circuit is arranged near a third side located between the first and second sides.

8. A radio communication device comprising:

a digital signal processor configured to handle, as digital signal, data to be transmitted or received;

an analog signal processor configured to handle the data as an analog signal;

a converter circuit which is provided between the digital signal processor and the analog signal processor configured to perform signal format conversion between the digital signal and the analog signal; and a board for mounting the digital signal processor, the analog signal processor, and the converter circuit thereon, wherein the analog signal processor is arranged on a first surface side of the board, the digital signal processor and the converter circuit are arranged on a second surface side of the board which is different from the first surface side, wherein the board is a multilayer wiring board comprising a plurality of wiring layers, and wherein a digital ground part is provided in a wiring layer inside the board, an analog ground part is provided in a wiring layer on the first surface side of the digital ground part, and a wiring layer on the first surface side of the analog ground part is assigned as an analog wiring layer.

\* \* \* \* \*